United States Patent [19]

Fujiwara et al.

[11] Patent Number: 4,761,561
[45] Date of Patent: Aug. 2, 1988

[54] LASER BEAM SCANNING PATTERN GENERATION SYSTEM WITH POSITIONAL AND DIMENSIONAL ERROR CORRECTION

[75] Inventors: Yoshihisa Fujiwara, Nagareyama; Akikazu Tanimoto, Yokohama; Hisakazu Kato, Tokyo; Manabu Hosoya; Shinji Miura, both of Yokohama; Fuyuhiko Inoue, Sagamihara; Yuichi Aoki, Yokohama, all of Japan

[73] Assignee: Nippon Kogaku K.K., Tokyo, Japan

[21] Appl. No.: 933,185

[22] Filed: Nov. 21, 1986

[30] Foreign Application Priority Data

Nov. 27, 1985 [JP] Japan ................. 60-266574
Dec. 13, 1985 [JP] Japan ................. 60-280477

[51] Int. Cl.$^4$ .......................................... G01N 21/86
[52] U.S. Cl. ................................. 250/548; 356/400
[58] Field of Search ................... 250/548, 557, 561; 356/375, 400, 401

[56] References Cited

U.S. PATENT DOCUMENTS

3,973,825  8/1976  Starkweather ............. 250/235
4,587,622  5/1986  Herzog ...................... 356/152
4,677,303  6/1987  Erdman ...................... 250/561

Primary Examiner—David C. Nelms
Assistant Examiner—Jessica Ruoff
Attorney, Agent, or Firm—Shapiro and Shapiro

[57] ABSTRACT

In a pattern generating system for scanning a pattern on a surface of a workpiece with a laser beam modulated by drawing data so as to form a pattern corresponding to design pattern data, a plurality of through holes are formed at predetermined positions of the workpiece. Beams transmitted through the through holes are directed to a sensor for generating a detection output representing positions of the transmitted beams. A computer generates position data of the through holes on the basis of the detection output and calculates a positional error and a deformation amount of the workpiece. A correcting device corrects the drawing on the basis of the positional error and the deformation amount.

17 Claims, 6 Drawing Sheets

LASER BEAM SCANNING PATTERN GENERATION SYSTEM WITH POSITIONAL AND DIMENSIONAL ERROR CORRECTION

BACKGROUND OF THE INVENTION

1. Field of the Invention

The present invention relates to a pattern generation system and, more particularly, to a pattern generation system for raster-scanning a laser beam on a workpiece to perform automatic drawing on the basis of design pattern data.

2. Related Background Art

Various types of conventional laser pattern generation system have been proposed. According to this system, a photoresist or dry film formed on a workpiece is scanned with a laser beam optically modulated on the basis of design pattern data, thereby forming a micropattern with high precision.

In order to form patterns on two-sided circuit boards, multilayer circuit boards, or film substrates, each board or substrate is subjected to repetitive pattern formation. During repetition of operations, patterns on the upper and lower surfaces of each two-sided circuit board and wiring patterns of the respective layers of each multilayer circuit board must be drawn with high precision.

If dimensional errors occur, positional errors occur in electrode positions of the upper and lower surfaces of the two-sided circuit board and wiring patterns of the respective layers of the multilayer circuit board. In the subsequent through hole formation process, electrodes to be connected to each other are then often disconnected and are erroneously connected to other conductive patterns to be electrically isolated from the electrodes. In addition, since a sufficient dimensional margin is not guaranteed, incomplete insulation may occur.

The dimensional errors are not only caused by drawing errors with a laser pattern but also mounting errors upon mounting of a substrate or board on a work table, and expansion/shrinkage of the board or substrate in intermediate treatments (e.g., heat and chemical treatments) performed during the repetitive exposure operation.

In order to prevent the substrate or board mounting error, fiducial points or lines are marked on a substrate and a table to locate the substrate at a predetermined position. More specifically, a plurality of pins extend on the table so as to respectively correspond to a plurality of through holes formed at predetermined positions of the substrate, thereby positioning the substrate in the accurate location.

However, in practice, if the substrate expands or shrinks, the pitches of the through holes are changed. In addition, since margins are provided for the through holes or the pins, it is difficult to perform accurate positioning. In practice, a substrate deformation amount during the intermediate treatments is manually measured, and a scanning distance along the X direction and the displacement of the table along the Y direction are finely adjusted to correct expansion/shrinkage at the time of pattern drawing.

The method of manually measuring the deformation amount requires cumbersome and time-consuming operations. In addition, correction errors caused by measurement errors are still involved.

SUMMARY OF THE INVENTION

It is an object of the present invention to provide a pattern generation system capable of accurately drawing a pattern by very accurate positioning.

It is another object of the present invention to provide a pattern generation system capable of detecting with high accuracy a deformation amount of a workpiece and a positional error caused by mounting of the workpiece on a table, thereby automatically correcting the errors on the basis of detection results.

According to an aspect of the present invention, there is provided a pattern generating system for scanning a pattern on a surface of a workpiece held on a table with a beam modulated by drawing data so as to form a pattern corresponding to design pattern data, wherein a plurality of through holes are formed at predetermined positions of the workpiece, and comprising detecting means for guiding beams transmitted through the through holes onto a sensor and for generating a detection output representing positions of the transmitted beams, computing means for generating position data of the through holes on the basis of the output from the detecting means and hence calculating a positional error and a deformation amount of the workpiece, and a correcting device for correcting the drawing on the basis of the positional error and the deformation amount.

DESCRIPTION OF THE PREFERRED EMBODIMENTS

Figure 1:
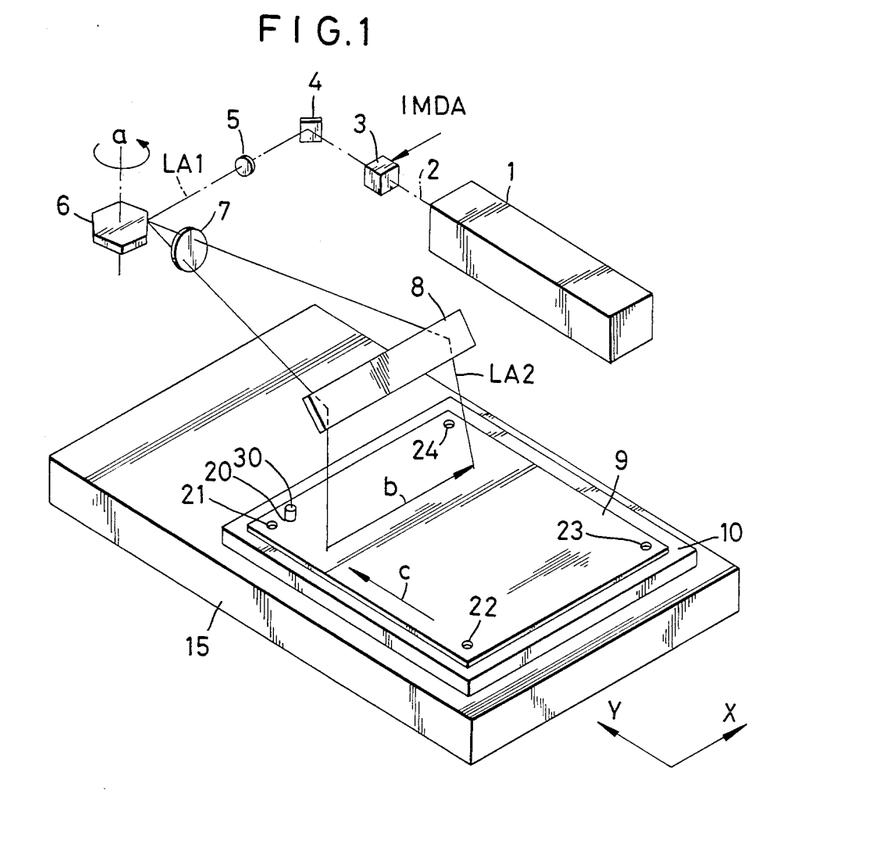
FIG. 1 is a schematic perspective view showing a system according to an embodiment of the present invention.

As shown in FIG. 1, a laser beam 2 emitted from a laser source 1 is supplied to an optoacoustic light modulator 3. The laser beam 2 is ON/OFF-modulated by the light modulator 3 in response to image data IMDA. The modulated laser beam is incident on a rotatable polygon mirror 6 through a mirror 4 and a lens 5.

The rotatable polygon mirror 6 is rotated counterclockwise in a direction of arrow a at a constant speed. An incident laser beam LA1 is reflected and deflected and is focused through a lens 7. The beam from the lens 7 is reflected by a mirror 8. The reflected beam is incident on the surface of a substrate 9 such as a circuit board or film.

Every time the laser beam LA1 is reflected by one of the reflecting surfaces of the rotatable polygon mirror 6 and then reflected by the mirror 8, the beam scans the substrate 9 in the X direction of arrow b at the constant speed.

The substrate 9 is fixed on a table 10, and the table 10 is movable along a base 15 along the Y direction. When a laser beam LA2 reflected by the mirror 8 is scanned along the direction of arrow b, the table 10 is moved along the Y direction.

X-direction scanning of the laser beam LA2 and the Y-direction displacement of the table 10 are repeated to form a pattern on the substrate 9 on the basis of the image data IMDA.

A plurality of through holes, e.g., four through holes 21, 22, 23 and 24 each having a circular section are formed at four corners of the substrate 9. When the substrate 9 having an accurate size complying with the design size is mounted on the table 10, axes of four detectors arranged at four corners of the table 10 are respectively aligned with those of the through holes 21, 22, 23 and 24 of the substrate 9.

Figure 2:
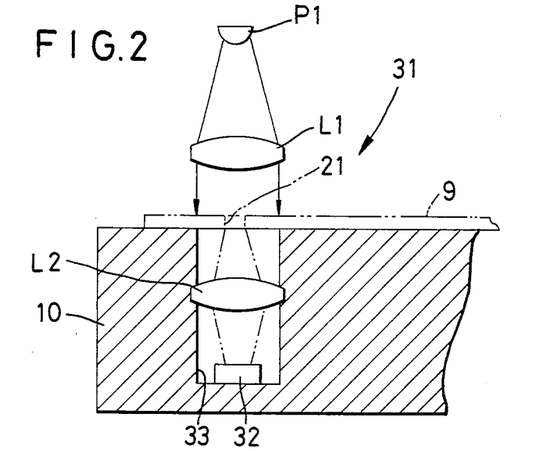
FIG. 2 is an enlarged sectional view showing a detailed arrangement of a detector.

As shown in FIG. 2, one detector 31 comprises a light source P1 located above the corresponding through hole, e.g., the through hole 21, and a lens L1 for collimating and guiding light from the light source P1 to the through hole 21. The light passing through the through hole 21 is projected onto a photosensor 32, and thus an image corresponding to the through hole 21 is formed on the photosensor 32.

Figure 3:
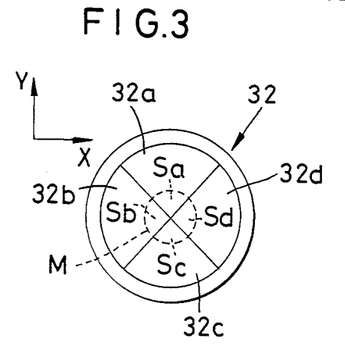
FIGS. 3, 4, 5 and 6 are respectively plan views of the photosensor in the detector in FIG. 2.

As shown in FIG. 3, the photosensor 32 consists of a plurality of elements, e.g., four elements 32a, 32b, 32c and 32d arranged in a recess 33. The recess 33 has a circular section and is formed in the table 10. The elements 32a, 32b, 32c and 32d constitute a four-split photosensor and comprise quadrants obtained by dividing a disk into four elements at equal angular intervals of 90°. When the axis of the through hole 21 is aligned with the central point of the photosensor 32, an image M of the through hole illuminates the symmetrical portions of all the elements about the central point of the photosensor 32, as indicated by a circuit of a broken line in FIG. 3.

The element 32d is located in the +X direction with respect to the central point of the photosensor 32, and the element 32b is located in the −X direction. The element 32a is located in the +Y direction with respect to the central point of the photosensor 32, and the element 32c is located in the −Y direction.

The elements 32a to 32d generate voltage outputs Va, Vb, Vc and Vd in proportion to amounts of light incident on the respective light-receiving surfaces, respectively. The amounts of light incident on the light-receiving surfaces of the elements respectively correspond to areas Sa, Sb, Sc and Sd of an image M of the through hole 21.

If the axis of the through hole 21 is aligned with the central point of the photosensor 32, the areas Sa, Sb, Sc and Sd of the image M in the respective elements are identical. Therefore, the voltage outputs Va, Vb, Vc and Vd are identical accordingly.

Figure 4:
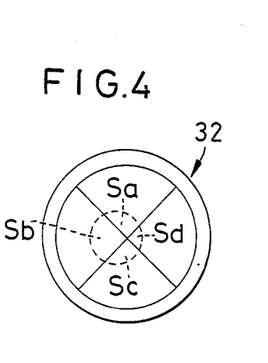

As shown in FIG. 4, however, when the axis of the through hole 21 is deviated from the central point of the photosensor, voltage outputs Va to Vd represent a deviation amount and its direction. For example, when the axis of the through hole 21 is displaced along the X direction, the image M guided to the photosensor is displaced in a direction opposite to displacement of the through hole 21. The elements 32a to 32d respectively generate the voltages Va, Vb, Vc and Vd proportional to the areas Sa, Sb, Sc and Sd of the image M. Therefore, an X-direction deviation $\Delta tx$ representing the deviation direction and amount of the through hole from the center of the photosensor 32 along the X direction can be represented as equation (1) by using the voltages Va to Vd:

$$\Delta tx = k(Vb - Vd)/(Vb + Vd) \quad (1)$$

where k is the proportional constant.

Figure 5:
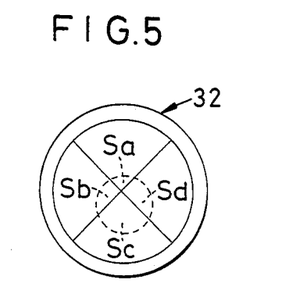

As shown in FIG. 5, if the axis of the through hole 21 is deviated from the center of the photosensor 32 along the Y direction, a Y-direction deviation $\Delta ty$ representing the deviation direction and amount of the through hole from the center of the photosensor 32 is given as follows:

$$\Delta ty = k(Va - Vc)/(Va + Vc) \quad (2)$$

Figure 6:
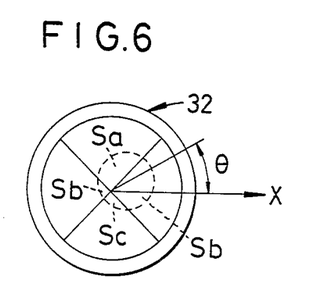

In general, as shown in FIG. 6, if the axis of the through hole 21 is deviated by $\Delta t$ from the central point of the photosensor 32 at an angle $\theta$ with respect to the X direction, the deviation $\Delta t$ can be represented by a sum of vectors of the X- and Y-direction deviations $\Delta tx$ and $\Delta ty$. The deviation at the angle $\theta$ can be represented as follows:

$$\Delta t = k\sqrt{\Delta tx^2 + \Delta ty^2} \quad (3)$$
$$= k\sqrt{(Vb - Vd)/(Vb + Vd)^2 + (Va - Vc)/(Va + Vc)^2}$$

$$\theta = \tan^{-1} \Delta ty/\Delta tx \quad (4)$$
$$= \tan^{-1} (Va - Vc)/(Va + Vc)/(Vb - Vd)/(Vb + Vd)$$

The four photosensors respectively generate output voltages $V_{31S}$ (Va, Vb, Vc and Vd), $V_{32S}$ (Va, Vb, Vc and Vd), $V_{33S}$ (Va, Vb, Vc and Vd), and $V_{34S}$ (Va, Vb, Vc and Vd) corresponding to deviations $\Delta t$ (these deviations are represented by $\Delta t21$, $\Delta t22$, $\Delta t23$ and $\Delta t24$ respectively corresponding to the through holes 21 to 24) from the central points of the photosensors. The voltage outputs V31S to V34S from the four photosensors are input to a computer 36 through an interface 35 shown in FIG. 7.

Figure 7:
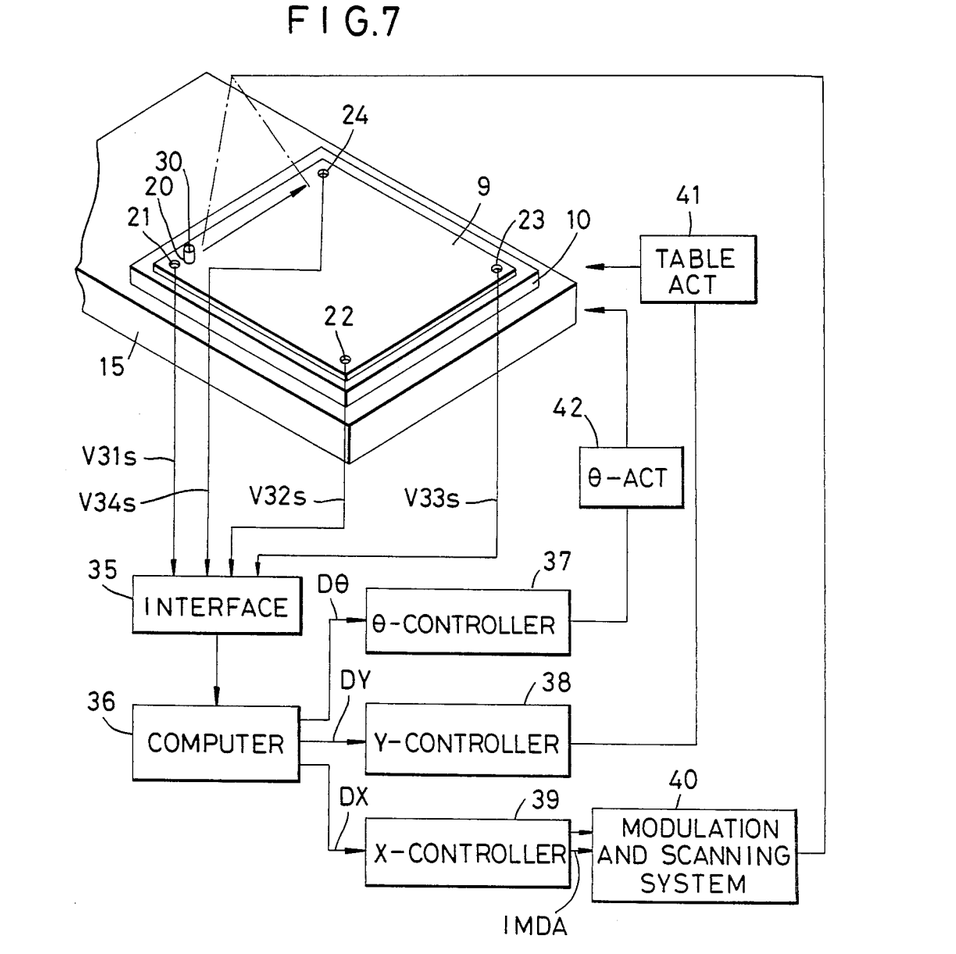
FIG. 7 is a block diagram of a controller of the embodiment in FIG. 1.

The computer 36 calculates a positional deviation of the substrate 9 from the table 10 and the deformation amount of the substrate 9 on the basis of the output voltages from the photosensors in the detectors, and determines a necessary correction amount. The computer 36 sends Y-component correction data DY to a Y-controller 38, X-component correction data DX to an X-controller 39, and rotational component correction data D$\theta$ to a $\theta$-controller 37. In other words, the computer 36 performs calculations according to equations (1) to (4) using the output voltages $V_{31S}$ to $V_{34S}$ of the photosensors to obtain deviations of the through holes 21 to 24 from the central axis of the photosensor 32. The deformation amount and the positional error of the substrate 9 are measured on the basis of the calculated results. The computer 36 then generates a signal for correcting the deformation amount and the positional error.

If the substrate 9 free from expansion/shrinkage with respect to the design size is deviated by $\Delta t$ along the X direction upon its mounting on the table 10, X-direction deviations of the through holes 21 to 24 are represented as $\Delta t21x$, $\Delta t22x$, $\Delta t23x$ and $\Delta t24x$ according to equations (1) and (2), and Y-direction deviations of the through holes 21 to 24 are represented as $\Delta t21y$, $\Delta t22y$, $\Delta t23y$ and $\Delta t24y$ as follows:

$$\Delta t21x = \Delta t22x = \Delta t23x = \Delta t24x = \Delta tx \quad (5)$$

$$\Delta t21y = \Delta t22y = \Delta t23y = \Delta t24y = \Delta ty \quad (6)$$

$$\Delta tx = k(Vb - Vd)/(Vb + Vd) \quad (7)$$

$$\Delta ty = 0 \quad (8)$$

The computer 36 sends the value $\Delta tx$ of equation (7) as the X-component correction data dX to the X-controller 39.

Similarly, when the substrate 9 free from expansion/shrinkage is deviated by $\Delta t$ along the Y direction, the deviation directions and amounts of the through holes 21 to 24 are given as follows:

$$\Delta t21x = \Delta t22x = \Delta t23x = \Delta t24x = \Delta tx \quad (9)$$

$$\Delta t21y = \Delta t22y = \Delta t23y = \Delta t24y = \Delta ty \quad (10)$$

$$\Delta tx = 0 \quad (11)$$

$$\Delta ty = k(Va - Vc)/(Va + Vc) \quad (12)$$

The computer 36 sends the value $\Delta ty$ of equation (12) as the Y-direction correction data DY to the Y-controller 38.

When the substrate 9 free from expansion/shrinkage is translated by $\Delta t$ at an angle $\theta$ with respect to the X direction, deviation directions and amounts of the through holes 21 to 24 are given as follows:

$$\Delta t21x = \Delta t22x = \Delta t23x = \Delta t24x = \Delta tx \quad (13)$$

$$\Delta t21y = \Delta t22y = \Delta t23y = \Delta t24y = \Delta ty \quad (14)$$

$$\Delta tx = k(Vb - Vd)/(Vb + Vd) \quad (15)$$

$$\Delta ty = k(Va - Vc)/(Va + Vc) \quad (16)$$

The computer 36 sends the value $\Delta tx$ of equation (15) as the X-direction correction data DX to the X-controller and the value $\Delta ty$ of equation (16) as the Y-direction correction data Dy to the Y-controller 38.

When the substrate 9 free from expansion/shrinkage is rotated counterclockwise at a small angle $\Delta \theta$ about an axis perpendicular to the X-Y coordinate system, deviation directions and amounts of the through holes 21 to 24 are given as follows:

$$\Delta t21x = \Delta t22x = \Delta t23x = \Delta t24x = \Delta tx \quad (17)$$

$$\Delta t21y = \Delta t22y = \Delta t23y = \Delta t24y = \Delta ty \quad (18)$$

$$\Delta \theta 1 = \Delta \theta 2 = \Delta \theta 3 = \Delta \theta 4 = \Delta \theta \quad (19)$$

$$\Delta tx = k(Vb - Vd)/(Vb + Vd) \quad (20)$$

$$\Delta ty = k(Va - Vc)/(Va + Vc) \quad (21)$$

$$\Delta \theta = \tan^{-1} \Delta tx/\Delta ty \quad (22)$$

The computer 36 sends the angle $\Delta\theta$ of equation (22) as the rotational component correction data $D\theta$ to the $\theta$-controller 37.

Assuming that distances between the X-direction through holes 21 and 24 and between the Y-direction through holes 22 and 23 are defined as Lx, if the substrate 9 is deviated by a small distance $\Delta Lx$ along the X direction, an elongation $\alpha x$ can be derived from equations (1) and (2) as follows:

$$\Delta t21x - \Delta t24x = \Delta t22x - \Delta t23x = \Delta Lx \quad (23)$$

$$\alpha X + (\Delta Lx + Lx)/Lx \quad (24)$$

The computer 36 sends the elongation $\alpha x$ of equation (24) as the X-direction correction data DX to the X-controller 39.

Similarly, when a distance Ly between the Y-direction through holes in the substrate 9 is changed by $\Delta Ly$, an elongation $\Delta y$ along the Y direction is given as follows:

$$\Delta t21y = \Delta t22y = \Delta t23y = \Delta 24y = \Delta Ly \quad (25)$$

$$\alpha y = (\Delta Ly + Ly)Ly \quad (26)$$

The computer 36 sends the elongation $\alpha y$ of equation (26) as the y-component correction data DY to the Y-controller 38.

As described above, the computer 36 calculates the deviation amounts and directions of the photosensors corresponding to the through holes 21 to 24 on the basis of output voltages from the photosensors. The deformation amount of the substrate 9 and the positional error thereof are calculated on the basis of the deviation directions and amounts, thereby outputting the correction data DX, DY and $\theta$.

The X-controller 39 changes timings of the light modulator 3 and the rotational polygon mirror 6, both of which are included in a laser beam modulation scanning system 40 on the basis of the X-direction correction data dX, thereby moving the drawing start point on the substrate 9 along the X direction and hence correcting the positional error along the X direction. In order to correct an X-direction deformation amount, a clock rate of the image data IMDA is slightly changed according to the elongation $\alpha x$, thereby performing drawing so as to correct the deformation of the substrate 9.

The Y-controller 38 controls a table actuator 41 on the basis of the Y-direction correction data DY to move the table 10 according to the Y-direction deviation. The drawing state position of the substrate 9 along the Y direction is shifted to correct the Y-direction deviation. In order to correct the Y-direction deformation of the substrate 9, the moving speed of the table 10 is slightly changed according to the elongation $\alpha y$. Drawing is thus performed so as to correct the deformation of the substrate 9.

The θ-controller 37 drives a θ-actuator 42 on the basis of the rotational component correction data Dθ to correct the rotational error of the substrate 9.

Figure 8:
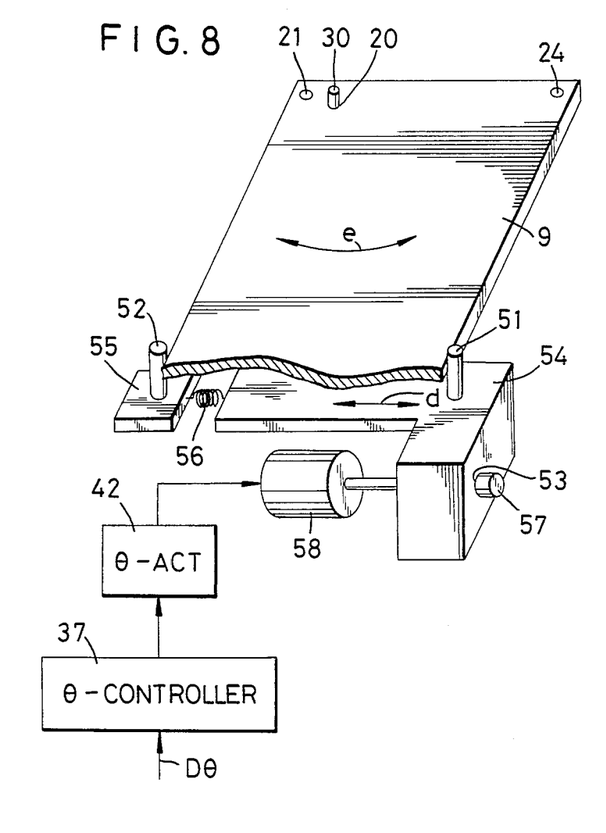
FIG. 8 is a perspective view showing a detailed arrangement of a correction device for correcting rotational components of a substrate.

A device shown in FIG. 8 can be used as a means for correcting rotation of the substrate 9. A stepping motor 58 is fixed on the table 10 and is driven by the θ-controller 37 and the θ-actuator 42 on the basis of the rotational component correction data Dθ. An output shaft 57, the distal end of which is threaded, is rotated.

A sliding member 54 has a female screw 53 screwed in the screw hole of the output shaft 57. As the output shaft 57 is rotated, the sliding member 54 is guided by the table 10 and translates linearly along the direction of arrow d.

A pin 51 extends on the sliding member 54 and abuts against the side surface of the substrate 9. A through hole 20 extends upward in the table 10 near the through hole 21 of the substrate 9 which is detected by the corresponding detector, e.g., the detector 31. A pin 30 is rotatably fitted in the through hole 20, so that the substrate 9 is pivotal about the pin 30 in a direction of arrow e.

In addition, a sliding member 55 is guided by the table 10. A pin 52 extends upward on the sliding member 55, and the sliding member 55 is coupled to the sliding member 54 through a spring 56, so that the sliding members 54 and 55 clamp the table 9 therebetween and can be linearly guided along directions of double-headed arrow d.

With the above arrangement, when the substrate 9 is mounted on the table 10 such that the pin 30 on the table 10 is inserted in the through hole 20, as shown in FIG. 7, the voltage outputs $V_{31S}$ to $V_{34S}$ corresponding to the deviations of the through holes 21 to 24 of the substrate 9 from the centers of the photosensors are generated by the photosensors 32, respectively.

The voltage outputs $V_{31S}$ to $V_{34S}$ are input to the computer 36 through the interface 35, and the computer 36 determines the positional errors $\Delta tx$ and $\Delta ty$ of the through holes 21 and 24.

Subsequently, the computer 36 calculates the rotational component of the deviation of the substrate 9, the X and Y components, and elongations $\alpha x$ and $\alpha y$ along the X and Y directions, thereby determining correction amounts. The computer 36 thus outputs the corresponding rotational component correction data Dθ, the X-component correction data DX, and the Y-component correction data DY.

The X-controller 39 controls the laser beam modulation scanning system 40 on the basis of the X-component correction data DX to generate a pattern free from the expansion and shrinkage the substrate 9 along the X direction.

The Y-controller 38 controls the table actuator 41 on the basis of the Y-component correction data DY to generate a pattern free from the position error and expansion/shrinkage of the substrate 9 along the Y direction.

In addition, the θ-controller 37 corrects the rotational error of the substrate 9 on the basis of the rotational component correction data Dθ.

An average value θ of the rotational component deviation $\theta 31$, $\theta 32$, $\theta 33$, and $\theta 34$ of the elements calculated by equation (22) is calculated as follows:

$$\theta = (\theta 31 + \theta 32 + \theta 33 + \theta 34)/4 \qquad (27)$$

The rotational angle is corrected by the average angle $\bar{\theta}$. Thereafter, the deviations are detected again, and the X- and Y-direction displacements $\Delta tx$ and $\Delta ty$, and the deformation amounts $\alpha x$ and $\alpha y$ are calculated to perform correction.

According to a second correction method, the center of rotation of the rotational component deviations is calculated on the basis of the rotational deviation $\theta 31$ to $\theta 34$ and the position of the photosensors. A difference between the deviated center of rotation and the center of rotation (i.e., the pin 30 in FIG. 8) at the time of correction is calculated to prepare rotational component correction data Dθ to simultaneously output the X- and Y-direction correction data DX and DY.

With the above arrangement, the positional error of the substrate 9 at the time of mounting thereof on the table 10 and expansion/shrinkage of the substrate during the intermediate treatments can be automatically corrected to generate a pattern free from deviations. Even if the substrate 9 comprises a two-sided or multilayer circuit board, the pattern alignment between the layers can be accurately performed in a short period of time, thereby preventing disconnections and shortcircuit of the patterns.

In the embodiment described with reference to FIG. 8, the pins 51 and 52 are disposed in abutment with the side surfaces of the substrate 9 to correct the rotational component of the substrate 9. However, a through hole may be formed in the substrate 9, and the pin 51 or 52 may be inserted in this through hole. In this case, since the pin 51 or 52 alone can correct the rotational component of the substrate 9, a system having a rotational component correction device can be provided with a simpler arrangement.

Figure 9:
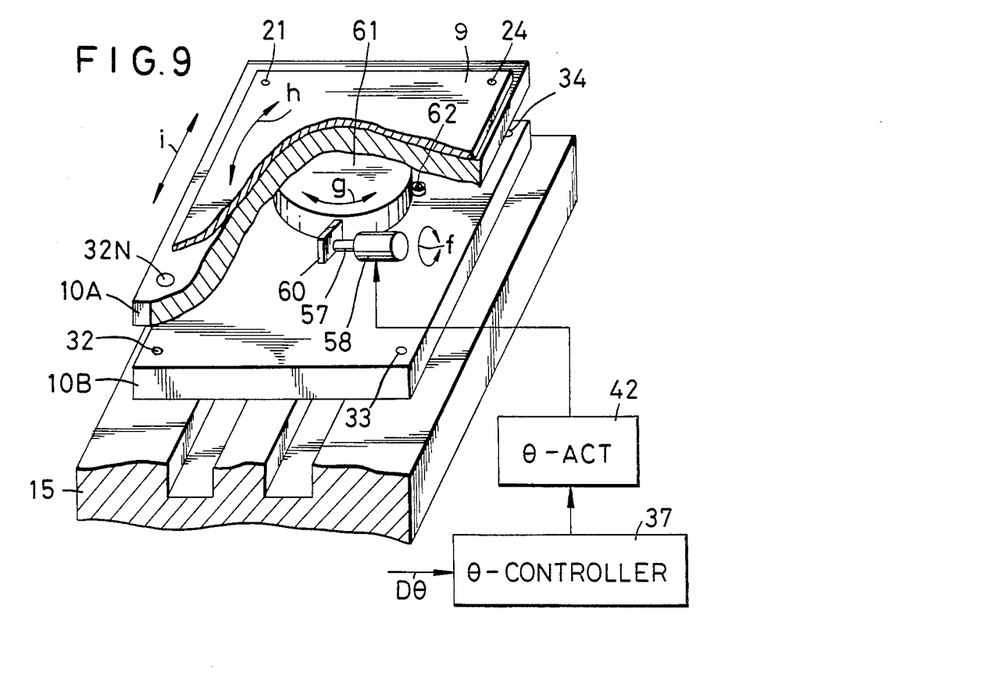
FIG. 9 is a perspective view showing another arrangement of a correction device.

FIG. 9 shows another embodiment of a rotational component correction device. The same reference numerals as in FIG. 8 denote the same parts in FIG. 9. Instead of the rotational component correction device for correcting the rotational component by rotating only the substrate 9 in FIG. 8, a table 10A can be rotated while the substrate 9 is fixed on the table 10A. The substrate 9 is chucked on the table 10A by a vacuum suction means or the like.

The table 10A is fixed on a disk 61, and the disk 61 is rotatably supported by a stage 10B. The stage 10B can be moved along a base 15 in a direction (i.e., the Y-direction) indicated by arrow i. Through holes 31N to 34N are formed at four corners of the table 10A to guide the images of through holes 21 to 24 in the substrate 9 to detectors 31 to 34, respectively.

A stepping motor 58 and disk 61, both of which are driven by a θ-actuator 42, are arranged on the stage 10B. The θ-actuator 42 is controlled on the basis of rotational component correction data Dθ input to a θ-controller 37. Therefore, the substrate 9 can be rotated in directions of double-headed arrow g through a plurality of rollers 62.

A screw at the distal end of an output shaft 57 of the pulse motor 58 is engaged with a female screw hole of a projection 60 disposed at the circumferential surface of the disk 61, thereby rotating the output shaft 57 in directions of double-headed arrow f and hence pivoting the disk 61 in the directions of double-headed arrow g.

With the above arrangement, when the rotational component correction data Dθ is output, the θ-controller 37 controls the θ-actuator 42 to rotate the pulse motor 58 along one of the directions of double-headed arrow f. In this case, the disk 61 is rotated in the corresponding one of the directions of double-headed arrow g through the projection 60. As a result, the table 10A is rotated in the corresponding one of the directions of double-headed arrow h. As a result, the rotational component error of the substrate 9 can be corrected.

In the rotational component correction device having the arrangement of FIG. 9, the through hole 20 (FIG. 8) can be eliminated from the substrate 8, and thus the substrate 9 can be efficiently utilized.

Other various types of rotational component correcting means may be used in place of the ones of the above embodiments.

In the above embodiments, the position detecting through holes 21 to 24 is formed at the four corners of the substrate, respectively. However, a plurality of through holes may be formed at other places. In the above embodiments, photosensors comprising four-split detectors are used as the detecting means. However, other photodetecting elements such as CCDs or phototubes may be used.

In the above embodiments, the focusing lens L2 is used. However, if collimated beams can be emitted into the through holes 21 to 24, the focusing lens may be omitted.

Furthermore, the positions of the photosensors 32 are not limited to the focusing position of the focusing lens 12. However, the photosensors 32 may be located at positions excluding the focusing position of the focusing lens L2 to obtain the same effect as described above.

In the above embodiments, the photosensors are arranged on the table 10, and the light source is arranged above the substrate 9. However, the photosensors may be arranged above the substrate 9, and the light source may be arranged on the table 10. The number of light sources need not correspond to the number of through holes 21 to 24. A single light source unit including a plurality of light sources may be used to obtain the same effect as in the above embodiments.

In the above embodiments, patterns are formed on the upper and lower surfaces of the substrate. However, the pattern generation system is applicable to a workpiece consisting of a plurality of layers. In this case, the pattern formation positions of the layers constituting the workpiece can be accurately aligned.

Figure 10:
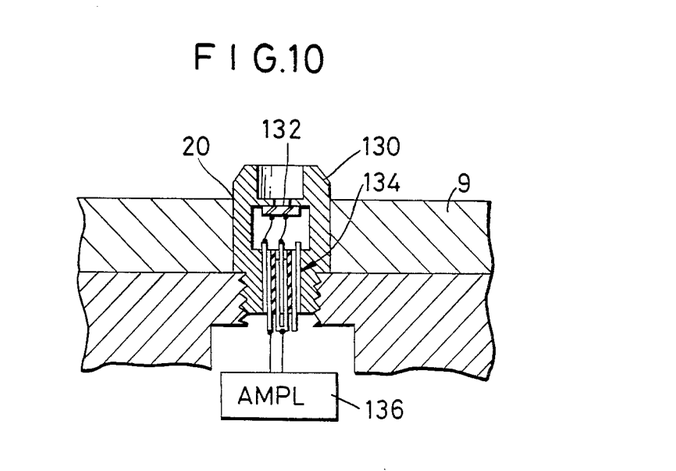
FIG. 10 is a sectional view showing a modification of a positioning pin in FIG. 1.

A pin 130 having a photosensor shown in FIG. 10 may be formed on the table 10 in place of the positioning pin 30 of FIG. 1. In this case, a more accurate positional relationship between the laser beam LA2 and the substrate or table can be obtained.

Referring to FIG. 10, the pin 130 has a cylindrical shape. A circular aperture is formed in the pin 130 at the same level as that of the substrate 9. The axis of the circular aperture is aligned with that of the pin 130. A photosensor 132 is fitted in the aperture such that the axis of the aperture is aligned with that of the photosensor 132. The leads of the photosensor 132 are connected to a preamplifier 136 through a coaxial connector 134. A photocurrent flowing through the photosensor is converted into a voltage signal. The voltage signal is thus extracted by the preamplifier 136.

When the laser beam LA2 crosses the center of the photosensor 132, one peak output is generated by the preamplifier 136. The timing for obtaining this peak output is used as the pattern generation reference point to control X- and Y-controllers. Even if positional errors occur between the table 10 and the optical elements 1 to 8, an accurate pattern can be formed at the predetermined position of the substrate 9.

In the above embodiments, the through holes 21 to 24 and the four detectors 31 are formed at the four corners of the substrate and the table, respectively. Therefore, only substrates having the through holes corresponding to the detectors can be used. In other words, a substrate having different outer dimensions cannot be mounted on the table.

In an embodiment to be described below, a table is designed to commonly place different types of substrates (FIG. 11) thereon so as to automatically correct the positional errors and deformation of the substrates.

Figure 11:
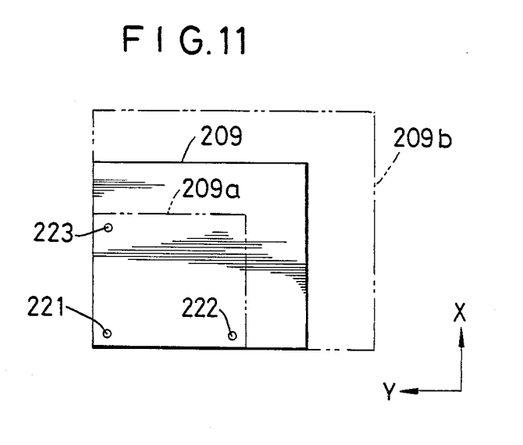
FIG. 11 is a plan view of a substrate according to another embodiment of the present invention.

Referring to FIG. 11, three through holes 221, 222, and 223 are formed in each of substrates 209 having different sizes along two adjacent sides of each substrate. The pitches between the through holes 221, 222 and 223 and hole diameters of the substrates 209 are identical and determined accoding to a smallest substrate 209a as a reference. The through holes 221, 222 and 223 are located at three corners of the smallest substrate 209a. A largest substrate 209b is determined according to the size of the upper surface of the table, the main scanning width (the X direction) of the laser beam, and the subscanning width (the Y direction) thereof. Any substrate having a size falling within the range between the smallest substrate 209a and the largest substrate 209b can be selected.

Figure 12:
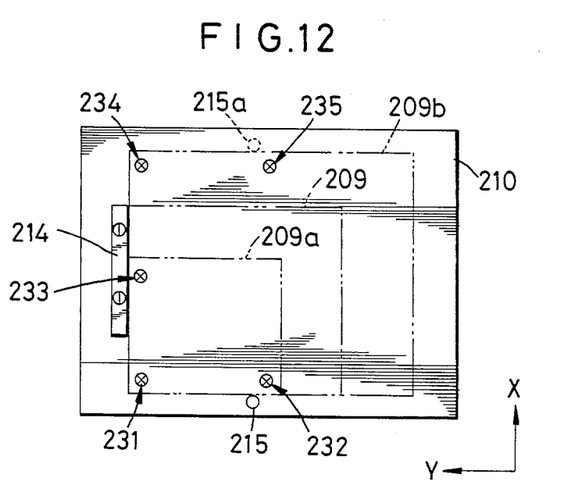
FIG. 12 is a plan view showing a table suitable for the substrate in FIG. 11.

Five detectors 231, 232, 233, 234 and 235 are arranged on a stage 210 for receiving the substrate thereon to detect the positions of the through holes 221, 222 and 223 as shown in FIG. 12. When the standard substrate 209 free from expansion/shrinkage is accurately mounted on the stage 210, i.e., when the substrate is mounted such that two sides thereof are respectively in contact with a limit pin 215 extending on the table 210 and a guide plate 219 arranged along the X direction, the axes of the detectors 231, 232 and 233 are respectively aligned with the through holes 221, 222 and 223 in the substrate.

The detectors 231 to 235 have the same arrangement as the detector 31 in FIG. 2. The arrangement of the control system in FIG. 7 is applicable to this embodiment.

According to this embodiment, even if a substrate having a given size is replaced with another substrate having a size different from the given size, a pattern having a predetermined size can be always accurately formed at a predetermined position of the substrate. The guide plate 214 and the limit pin 215 abut against the adjacent sides of the substrate to position the substrate. Since the substrate can be freely expanded or shrunk throughout the area, the substrate is uniformly expanded or shrunk throughout the surface and is not warped.

A pattern is formed on the lower surface of the substrate 209. The limit pin 215 fixed at the lower side (FIG. 12) is shifted to an upper position 215a indicated by a circle of the broken line. The substrate 209 is turned over and placed on the table such that two adjacent sides are in contact with the guide plate 214 and the limit pin 215a. The substrate is fixed in position by vacuum suction. The through holes 221, 222 and 223 of the substrate oppose the detectors 234, 235 and 233, respectively.

By symmetrically arranging the plurality of detectors about the X- or Y-axis, the patterns for the upper and lower surfaces of the substrate can be accurately aligned and formed.

What is claimed is:

1. A pattern generation system comprising:
   means for holding a workpiece on a flat surface, the workpiece having a plurality of openings extending through the workpiece in a direction perpendicular to the flat surface;
   means for scanning the workpiece with an energy beam modulated on the basis of design data and for generating a pattern on the workpiece;
   detecting means having a plurality of photosensors respectively opposite said plurality of openings and means for radiating the light beam through said openings corresponding to said photosensors, said plurality of photosensors being adapted to generate detection outputs representing relative positions between said photosensors and said openings corresponding thereto within the flat surface;
   means for determining two-dimensional positional errors of the workpiece on the flat surface with respect to said holding means, on the basis of the detection outputs from said plurality of photosensors; and
   means for correcting the two-dimensional positional errors in response to operation of said determining means.

2. A system according to claim 1, wherein said plurality of photosensors are fixed at predetermined positions on said holding means.

3. A system according to claim 1, wherein each of said plurality of photosensors has a detecting surface to receive said light beam and generates a detection output representing a deviation direction and a deviation amount from the corresponding opening within the flat surface on the basis of a positional relationship between said detecting surface and said light beam.

4. A system according to claim 3, wherein said determining means determines a rotational direction and a rotational angle of the workpiece within the flat surface.

5. A system according to claim 4, wherein said correcting means includes means for rotating the workpiece about an axis perpendicular to the flat surface with respect to said holding means.

6. A system according to claim 4, wherein said correcting means includes means for rotating said holding means and the workpiece together about an axis perpendicular to the flat surface.

7. A system according to claim 3, wherein said correcting means controls said scanning means on the basis of the two-dimensional positional errors.

8. A system according to claim 7, wherein said determining means determines deviation directions and deviation amounts of the workpiece along first and second directions perpendicular to each other on the flat surface.

9. A system according to claim 1, wherein said determining means determines a deformation amount of the workpiece.

10. A system according to claim 1, wherein said determines means receives the detection outputs and determined rotation of the workpiece on the flat surface, positional errors of the workpiece along first and second directions perpendicular to each other, and deformation of the workpiece; and said correcting means includes rotation correcting means for correcting the rotation of the workpiece and means for controlling said scanning means to correct the positional errors along the first and second directions and the deformation of the workpiece.

11. A pattern generation system comprising:
   means for holding a workpiece on a flat surface thereof, said holding means being provided with at least three photoelectric position detectors arranged on the flat surface in a predetermined positional relationship, said holding means being commonly used for a plurality of workpieces having different sizes, each of said plurality of workpieces having at least three openings extending through said each workpiece in a direction perpendicular to the flat surface, and said three openings respectively corresponding to said at least three photoelectric position detectors;
   means for scanning the workpiece on said holding means with an energy beam modulated corresponding to design data and for generating a pattern on the workpiece;
   means for determining two-dimensional positional errors of the workpiece on the flat surface with respect to said holding means, in response to detection outputs from said three position detectors; and
   means for correcting the two-dimensional position errors in response to an operation of said determining means.

12. A system according to claim 11, wherein said correcting means controls said scanning means so as to cancel the two-dimensional position errors.

13. A system according to claim 11, wherein two of said three position detectors are spaced apart from each other by a predetermined distance along a first direction of the flat surface, and a remaining one of said three position detectors is spaced apart by a predetermined distance from one of said two position detectors on the flat surface along a second direction perpendicular to the first direction.

14. A system according to claim 11, wherein said holding means includes first and second position detectors spaced apart from each other by a predetermined distance on the flat surface along a first direction, third and fourth position detectors symmetrical with said first and second position detectors about a central line parallel to the first direction, and a fifth position detector arranged on the central line.

15. A system according to claim 14, wherein said first, third, and fifth position detectors are aligned in line on the flat surface along the second direction perpendicular to the first direction.

16. A pattern generation system comprising:
   means for holding a workpiece on a flat surface;
   a positioning member arranged at a predetermined position on said holding means and coupled to said workpiece so as to define a position of the workpiece on said holding means;
   means for scanning the workpiece with an energy beam modulated corresponding to design data and for generating a pattern on the workpiece; and
   sensor means, arranged on said positioning member, for generating an output signal in response to the energy beam, the timing of said output signal providing a fixed reference point for the generation of said pattern by said scanning means.

17. A system according to claim 16, wherein the workpiece has an opening extending therethrough along a direction perpendicular to the flat surface, and said positioning member is fitted in said opening of the workpiece.

* * * * *